United States Patent
Minoura et al.

(10) Patent No.: US 11,920,242 B2
(45) Date of Patent: Mar. 5, 2024

(54) TEMPERATURE CONTROL METHOD AND PLASMA PROCESSING APPARATUS

(71) Applicant: Tokyo Electron Limited, Tokyo (JP)

(72) Inventors: Yuya Minoura, Miyagi (JP); Kaho Enomoto, Miyagi (JP); Hayato Sakai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 74 days.

(21) Appl. No.: 17/197,325

(22) Filed: Mar. 10, 2021

(65) Prior Publication Data

US 2021/0287886 A1 Sep. 16, 2021

(30) Foreign Application Priority Data

Mar. 13, 2020 (JP) ................... 2020-044272

(51) Int. Cl.
*C23C 16/46* (2006.01)
*C23C 16/44* (2006.01)
*H01J 37/32* (2006.01)

(52) U.S. Cl.
CPC .......... *C23C 16/46* (2013.01); *C23C 16/4405* (2013.01); *C23C 16/463* (2013.01); *C23C 16/466* (2013.01); *H01J 37/32724* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 10,254,774 | B2 * | 4/2019 | Miura | H01L 21/6831 |
| 2005/0221020 | A1 * | 10/2005 | Fukiage | H01J 37/32862 |
| | | | | 257/E21.261 |
| 2009/0321017 | A1 * | 12/2009 | Tsubone | H01L 21/67109 |
| | | | | 156/345.27 |
| 2016/0104605 | A1 * | 4/2016 | Hiroki | H01L 21/67109 |
| | | | | 62/160 |

FOREIGN PATENT DOCUMENTS

JP 2011-054825 A 3/2011

* cited by examiner

*Primary Examiner* — Eric W Golightly
*Assistant Examiner* — Arlyn I Rivera-Cordero
(74) *Attorney, Agent, or Firm* — Pearne & Gordon LLP

(57) ABSTRACT

A temperature control method includes a switchover process, an ignition process, a slope calculation process, a first and a second control processes. In the switchover process, a heat medium to be supplied into a flow path is switched from a heat medium of a first temperature supplied from a first temperature controller to a heat medium of a second temperature supplied from a second temperature controller. In the slope calculation process, a slope of temperature change of the heat medium is calculated based on a temperature of the heat medium at an outlet side of the flow path. In the first control process, the second temperature controller is controlled until the temperature of the heat medium is stabilized to a temperature lower than a set value. In the second control process, the second temperature controller is controlled such that the temperature of the heat medium reaches the set value.

9 Claims, 12 Drawing Sheets

TEMPERATURE CONTROL METHOD AND PLASMA PROCESSING APPARATUS

CROSS-REFERENCE TO RELATED APPLICATION

This application claims the benefit of Japanese Patent Application No. 2020-044272 filed on Mar. 13, 2020, the entire disclosure of which is incorporated herein by reference.

TECHNICAL FIELD

The exemplary embodiments described herein pertain generally to a temperature control method and a plasma processing apparatus.

BACKGROUND

It has been known that a plasma processing apparatus performs plasma etching on a substrate such as a semiconductor wafer. When the etching is performed on the substrate, a reaction product may adhere to a peripheral portion of the substrate or a peripheral portion of a placing surface of a placing table on which the substrate is placed. The reaction product adhering to the peripheral portion of the placing surface (hereinafter, also referred to as "deposit") may cause a hindrance to attraction of the substrate onto the placing surface. In this regard, it has been suggested to remove the deposit by radiating, to the placing table, plasma formed from a mixed gas of an $O_2$ gas and a fluorine-containing gas.

Patent Document 1: Japanese Patent Laid-open Publication No. 2011-054825

SUMMARY

In one exemplary embodiment, a temperature control method includes a switchover process, an ignition process, a slope calculation process, a first control process and a second control process. In the switchover process, a heat medium to be supplied into a flow path provided inside a placing table, which is disposed inside a processing vessel of a plasma processing apparatus and configured to place a substrate thereon, is switched from a heat medium of a first temperature supplied from a first temperature controller when an etching processing is performed on the substrate to a heat medium of a second temperature supplied from a second temperature controller when the substrate is carried out of the processing vessel and then a cleaning process configured to remove a reaction product adhering to an electrostatic chuck provided on the placing table is performed. In the ignition process, plasma is ignited by starting to supply a cleaning gas. In the slope calculation process, a slope of temperature change of the heat medium is calculated based on a temperature of the heat medium at an outlet side of the flow path. In the first control process, the second temperature controller is controlled until the temperature of the heat medium at the outlet side of the flow path is stabilized to a third temperature lower than a predetermined set value. In the second control process, the second temperature controller is controlled in order for the temperature of the heat medium at the outlet side of the flow path to reach the set value.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
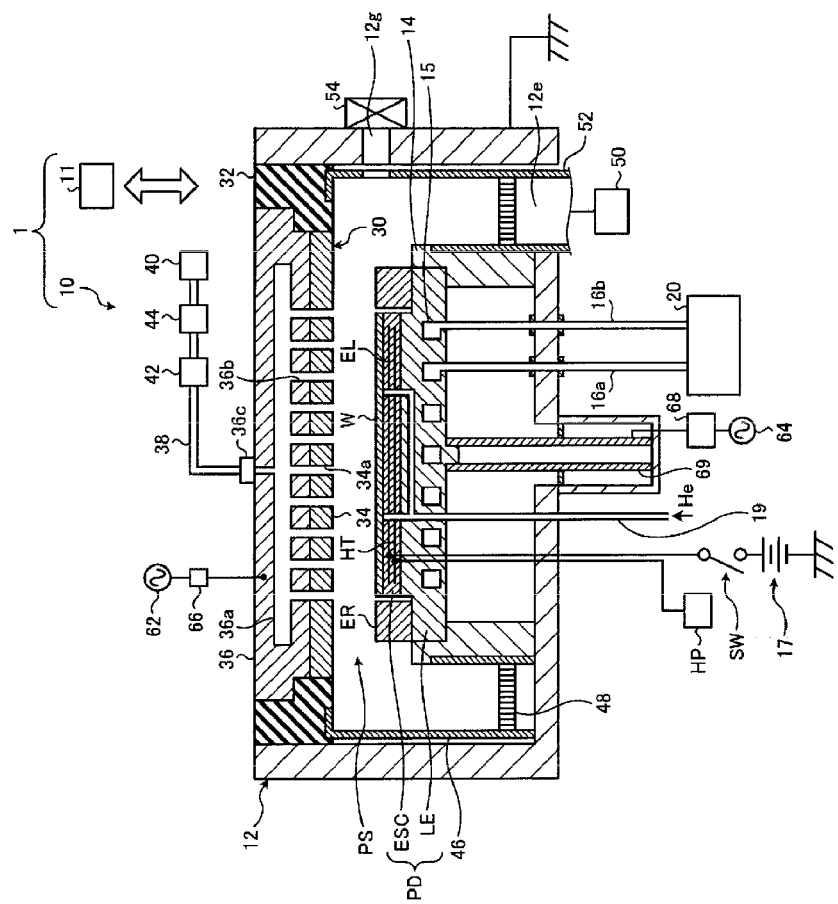
FIG. 1 is a schematic cross-sectional view illustrating an example of a plasma processing apparatus according to an exemplary embodiment of the present disclosure.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

The following exemplary embodiments are examples for describing the present disclosure, and the present disclosure is not limited thereto. In the following description, same parts or parts having same function will be assigned same reference numerals, and redundant description will be omitted.

Hereinafter, exemplary embodiments of a temperature control method and a plasma processing apparatus according to the present disclosure will be described in detail with reference to the accompanying drawings. However, the present disclosure is not limited to the exemplary embodiments described below.

When a stacked film of SiO and SiN (hereinafter, referred to as "ON stacked film") formed on a substrate (hereinafter, also simply referred to as "wafer") is etched, a cooled liquid-phase heat medium is supplied to a flow path provided inside a placing table to lower a temperature of the wafer to an extremely low temperature, for example, in a range of about −40° C. to about −80° C., in order to improve an etching rate and a mask selectivity. In such an etching processing, an organic deposit (reaction product) such as a CF-based polymer or the like adheres to a shoulder portion of an electrostatic chuck or an edge ring disposed on a placing surface of a placing table. For this reason, between etching processings for substrates, the deposit is removed by WLDC (Waferless Dry Cleaning) using $O_2$ gas. However, if the temperature of the wafer is lowered to the extremely low temperature, an amount of the deposit adhering to the wafer increases and the removal rate by WLDC becomes extremely slow, which requires an extremely long time for WLDC and causes deterioration in throughput. For this reason, it has been suggested to improve the removal rate by adjusting the temperature of the placing table to a high temperature when WLDC is performed. However, if the temperature of the heat medium flowing through the flow path provided inside the placing table is increased too high, the liquid-phase heat medium is vaporized, and, thus, the heat transfer efficiency decreases. Also, the vaporized heat medium is subjected to volumetric expansion, and, thus, the pressure inside the flow path increases. Therefore, the apparatus may structurally break down. Meanwhile, if the temperature of the heat medium is not enough to reach the vaporization temperature, which means the temperature is low, and, thus, the time required for WLDC increases. Therefore, it has been expected to reduce cleaning time by controlling the temperature of the heat medium to be as high as possible without vaporizing the heat medium.

[Configuration of Plasma Processing Apparatus 1]

FIG. 1 is a schematic cross-sectional view illustrating an example of a plasma processing apparatus according to an exemplary embodiment of the present disclosure. A plasma processing apparatus 1 is configured as, for example, a plasma etching apparatus including parallel plate electrodes. The plasma processing apparatus 1 is equipped with an apparatus main body 10 and a control device 11. The apparatus main body 10 includes a processing vessel 12 made of, e.g., aluminum or the like and having, e.g., an approximately cylindrical shape. The processing vessel 12 has an inner wall surface that is anodically oxidized. Further, the processing vessel 12 is frame-grounded.

A support 14, which is made of an insulating material such as quartz or the like and has an approximately cylindrical shape, is disposed on a bottom of the processing vessel 12. The support 14 extends in a vertical direction (for example, toward an upper electrode 30) from the bottom of the processing vessel 12 inside the processing vessel 12.

A placing table PD is disposed inside the processing vessel 12. The placing table PD is supported by the support 14. The placing table PD holds a wafer W on an upper surface of the placing table PD. The wafer W is an example of a temperature control target object. The placing table PD has an electrostatic chuck ESC and a lower electrode LE. The lower electrode LE is made of a metal material such as aluminum or the like and has an approximately disc shape. The electrostatic chuck ESC is placed on the lower electrode LE. The lower electrode LE is an example of a heat exchange member configured to perform heat exchange with the temperature control target object.

The electrostatic chuck ESC has a structure in which an electrode EL as a conductive film is embedded between a pair of insulating layers or a pair of insulating sheets. A DC power supply 17 is electrically connected to the electrode EL via a switch SW. The electrostatic chuck ESC is configured to attract the wafer W onto an upper surface thereof by electrostatic force such as Coulomb force generated by a DC voltage supplied from the DC power supply 17. Accordingly, the electrostatic chuck ESC can hold the wafer W.

The electrostatic chuck ESC is supplied with a heat transfer gas, for example, He gas, through a pipe 19. The heat transfer gas supplied through the pipe 19 is supplied into a space between the electrostatic chuck ESC and the wafer W. By controlling a pressure of the heat transfer gas to be supplied into the space between the electrostatic chuck ESC and the wafer W, the thermal conductivity between the electrostatic chuck ESC and the wafer W can be controlled.

A heater HT serving as a heating element is also disposed inside the electrostatic chuck ESC. The heater HT is connected to a heater power supply HP. By supplying a power from the heater power supply HP to the heater HT, the wafer W on the electrostatic chuck ESC can be heated via the electrostatic chuck ESC. The temperature of the wafer W placed on the electrostatic chuck ESC is controlled by the lower electrode LE and the heater HT. The heater HT may be disposed between the electrostatic chuck ESC and the lower electrode LE.

An edge ring ER is disposed around the electrostatic chuck ESC so as to surround the edge of the wafer W and the electrostatic chuck ESC. The edge ring ER may also be referred to as a focus ring. The edge ring ER improves the in-plane uniformity of the processing on the wafer W. The edge ring ER is made of a material, such as quartz, that is appropriately selected depending on a material of an etching target film.

A flow path 15 in which a heat medium serving as an insulating fluid such as Galden (registered trademark) flows is provided inside the lower electrode LE. The heat medium may also be referred to as brine. The flow path 15 is connected to a temperature control device 20 via a pipe 16a and a pipe 16b. The temperature control device 20 controls the temperature of the heat medium flowing in the flow path 15 of the lower electrode LE. The heat medium whose temperature is controlled by the temperature control device 20 is supplied into the flow path 15 of the lower electrode LE through the pipe 16a. The heat medium that has flown in the flow path 15 is returned to the temperature control device 20 through the pipe 16b.

The temperature control device 20 is configured to switch a heat medium of a first temperature and a heat medium of a second temperature and supply the switched heat medium into the flow path 15 of the lower electrode LE. By switching the heat medium of the first temperature and the heat medium of the second temperature and supplying the switched heat medium into the flow path 15 of the lower electrode LE, the temperature of the lower electrode LE is switched between the first temperature and the second temperature. The first temperature may be a temperature equal to or lower than, e.g., 0° C., and the second temperature may be a temperature equal to or higher than, e.g., room temperature. In the following description, the heat medium of the first temperature will be described as "first heat medium" and the heat medium of the second temperature will be described as "second heat medium". The first heat medium and the second heat medium are different from each other in temperature, but both are fluids made of the same material. The temperature control device 20 and the control device 11 are an example of a heat medium control device.

A bottom surface of the lower electrode LE is electrically connected to a power feed rod 69 configured to supply a high frequency power to the lower electrode LE. The power feed rod 69 is made of a metal. Although not illustrated in FIG. 1, lifter pins configured to deliver the wafer W on the electrostatic chuck ESC and a driving mechanism therefor are placed inside a space between the lower electrode LE and the bottom of the processing vessel 12.

The power feed rod 69 is connected to a first high frequency power supply 64 via a matching device 68. The first high frequency power supply 64 is a power supply configured to generate a high frequency power, i.e., high frequency bias power, for ion attraction onto the wafer W, and generates the high frequency bias power having a frequency in the range of from 400 kHz to 40.68 MHz, e.g., a frequency of 13.56 MHz. The matching device 68 is a circuit configured to match an output impedance of the first high frequency power supply 64 with an input impedance on a load side (lower electrode LE side). The high frequency bias power generated by the first high frequency power supply 64 is supplied to the lower electrode LE through the matching device 68 and the power feed rod 69.

The upper electrode 30 is disposed above the placing table PD so as to face the placing table PD. The lower electrode LE and the upper electrode 30 are provided substantially parallel to each other. In a space between the upper electrode 30 and the lower electrode LE, plasma is formed. With the formed plasma, a plasma processing such as etching is performed on the wafer W held on an upper surface of the electrostatic chuck ESC. The space between the upper electrode 30 and the lower electrode LE is a processing space PS.

The upper electrode 30 is supported on an upper portion of the processing vessel 12 via an insulating shield member 32 made of, e.g., quartz or the like. The upper electrode 30 includes an electrode plate 34 and an electrode supporting body 36. A lower surface of the electrode plate 34 faces the processing space PS. The electrode plate 34 has a plurality of gas discharge openings 34a. The electrode plate 34 is formed of, for example, a material containing silicon.

The electrode supporting body 36 is made of a conductive material such as aluminum or the like and supports the electrode plate 34 from above in a detachable manner. The electrode supporting body 36 may have a non-illustrated water cooling structure. A diffusion space 36a is formed inside the electrode supporting body 36. A plurality of gas through openings 36b that respectively communicate with the gas discharge openings 34a of the electrode plate 34 extends downwards (toward the placing table PD) from the diffusion space 36a. The electrode supporting body 36 has a gas inlet opening 36c through which a processing gas is introduced into the diffusion space 36a, and the gas inlet opening 36c is connected to a pipe 38.

The pipe 38 is connected to a gas source group 40 via a valve group 42 and a flow rate controller group 44. The gas source group 40 includes a plurality of gas sources. The valve group 42 includes a plurality of valves, and the flow rate controller group 44 includes a plurality of flow rate controllers such as mass flow controllers. Each gas source of the gas source group 40 is connected to the pipe 38 via a corresponding valve of the valve group 42 and a corresponding flow rate controller of the flow rate controller group 44.

Accordingly, the apparatus main body 10 may supply processing gases from one or more gas sources selected from the gas source group 40 into the diffusion space 36a inside the electrode supporting body 36 at individually adjusted flow rates. The processing gases supplied into the diffusion space 36a are diffused inside the diffusion space 36a to be supplied into the processing space PS in a shower shape through the gas through openings 36b and the gas discharge openings 34a.

The electrode supporting body 36 is connected to a second high frequency power supply 62 via a matching device 66. The second high frequency power supply 62 is a power supply configured to generate a high frequency power for plasma formation, and generates the high frequency power having a frequency in the range of from 27 MHz to 100 MHz, e.g., a frequency of 60 MHz. The matching device 66 is a circuit configured to match an output impedance of the second high frequency power supply 62 with an input impedance on a load side (upper electrode 30 side). The high frequency power generated by the second high frequency power supply 62 is supplied to the upper electrode 30 via the matching device 66. Further, the second high frequency power supply 62 may be connected to the lower electrode LE via the matching device 66.

A deposition shield 46 made of aluminum coated with $Y_2O_3$ or quartz is detachably disposed along an inner wall surface of the processing vessel 12 and an outer side surface of the support 14. The deposition shield 46 is configured to suppress adhesion of an etching byproduct (deposit) to the processing vessel 12 and the support 14.

An exhaust plate 48 made of aluminum coated with $Y_2O_3$ or quartz is detachably disposed on the bottom side of the processing vessel 12 (on the side with the support 14) and between an outer side wall of the support 14 and an inner wall of the processing vessel 12. An exhaust port 12e is disposed under the exhaust plate 48. The exhaust port 12e is connected to an exhaust device 50 via an exhaust pipe 52.

The exhaust device 50 is equipped with a vacuum pump such as a turbo molecular pump and thus can decompress the space inside the processing vessel 12 to a desired vacuum level. A carry-in/out opening 12g for the wafer W is disposed on the side wall of the processing vessel 12 and the opening 12g can be opened/closed by a gate valve 54.

The control device 11 includes a processor, a memory and an input/output interface. The memory stores programs executed by the processor and recipes including processing conditions and the like. The processor executes a program read from the memory and controls each component of the apparatus main body 10 via the input/output interface based on the recipes stored in the memory to perform a predetermined processing, such as etching or the like, on the wafer W.

[Place where Deposit Adheres]

Figure 2:
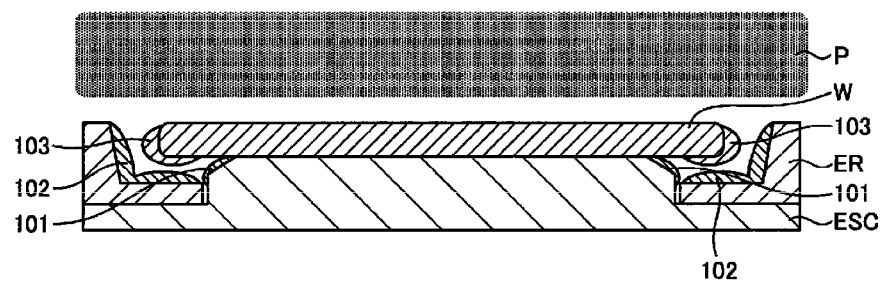
FIG. 2 is a diagram illustrating an example of a place where a deposit adheres.

Hereinafter, a place where a deposit adheres will be described with reference to FIG. 2. FIG. 2 is a diagram illustrating an example of a place where a deposit adheres. As shown in FIG. 2, when the wafer is processed with plasma P in a state where the wafer W is attracted onto the upper surface of the electrostatic chuck ESC, a deposit 101 adheres to a shoulder portion of the electrostatic chuck ESC near a boundary between the electrostatic chuck ESC and the edge ring ER. Also, a deposit 102 adheres to an upper surface of the edge ring ER between an outer peripheral portion of the wafer W and the edge ring ER, and a back side polymer (BSP) 103 adheres to a rear surface of the outer peripheral portion of the wafer W. As the deposits 101 and 102 and the BSP 103 decrease in temperature and the time required for plasma processing on the wafer W increases, an adhesion amount increases. If a plasma processing is consecutively performed on a plurality of wafers W, the BSP 103 is carried out of the processing vessel 12 together with the processed wafer W, but the deposits 101 and 102 continue to adhere to the places. Thus, the adhesion amount further increases. If the amounts of the deposits 101 and 102 increase, the deposits 101 and 102 may interfere with a subsequently transferred wafer W or the deposits 101 and 102 may fall onto the upper surface of the electrostatic chuck ESC, which may cause an error in attracting the wafer W. Further, in the following description, the deposits 101 and 102 may be collectively referred to as a shoulder deposit.

[Temperature Dependency of Removal Rate]

Figure 3:
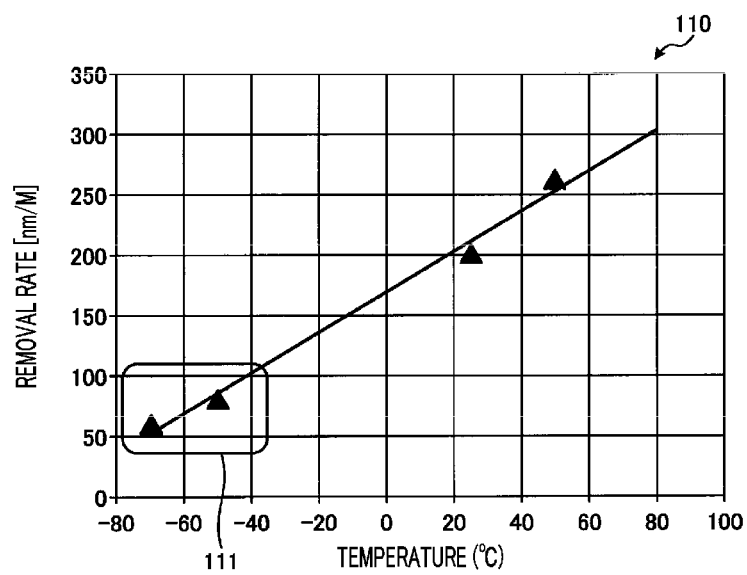
FIG. 3 is a graph showing an example of a temperature dependency of an etching rate of an organic film.

Hereinafter, a temperature dependency of a removal rate of a deposit will be described with reference to FIG. 3. FIG. 3 is a graph showing an example of a temperature dependency of an etching rate of an organic film. In FIG. 3, an organic film (photoresist) is used instead of the shoulder deposit to show the temperature dependency of the etching rate of the organic film corresponding to the removal rate of the deposit. As shown in a graph 110 of FIG. 3, as the temperature increases, the etching rate of the organic film also increases. From the above, it is clear that the removal rate of the shoulder deposit is very low in an extremely low temperature range 111 in which the ON stacked film is etched, and a considerable time is required to remove the shoulder deposit. For this reason, a low temperature etching process and a high temperature WLDC process are repeated to reduce the time required for removing the shoulder deposit and thus improve the throughput. In this case, the temperature is greatly adjusted between the low temperature process and the high temperature process. Further, in the following description, such temperature adjustment is also referred to as "inter-process temperature adjustment". Alternatively, after the low temperature etching process, a low temperature cleaning process in which a low temperature WWDC (Wafer With Dry Cleaning) and the low temperature WLDC using a dummy wafer are combined may be repeated several times and then, the high temperature WLDC process may be performed.

Figure 4:
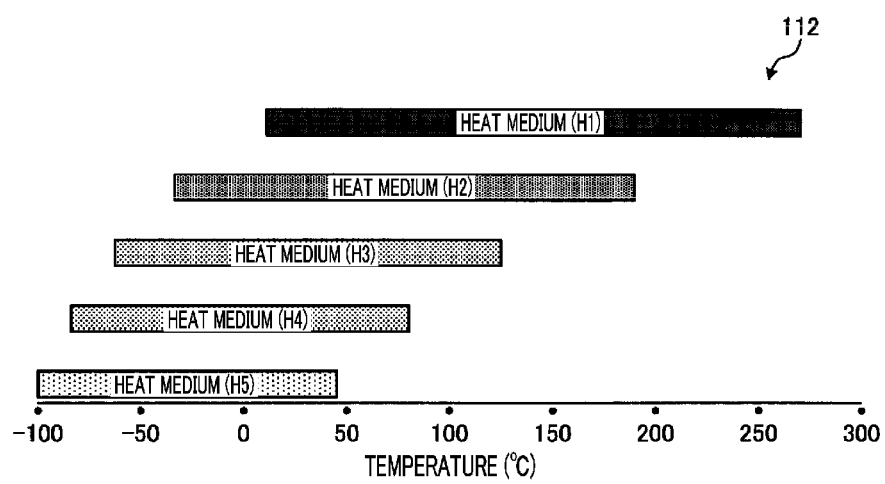
FIG. 4 is a graph showing an example of a usage temperature range of a heat medium.

In the inter-process temperature adjustment, the temperature range to be adjusted is broad, and, thus, the usage temperature range of the heat medium needs to be considered. FIG. 4 is a graph showing an example of the usage temperature range of the heat medium. A graph 112 of FIG. 4 shows the usage temperature ranges of various heat mediums H1 to H5. As shown in the graph 112, the heat medium H5, which can be used in an extremely low temperature range of −80° C. to −40° C., has a low vaporization temperature. It is desirable to use a heat medium suitable for low temperatures in order to achieve the performance of low temperature etching. Therefore, during temperature adjustment in a high temperature range, it is necessary to improve, if possible, the removal rate of the shoulder deposit while suppressing vaporization. Hereinafter, the temperature control device 20 configured to perform the above-described temperature control will be described in detail.

[Configuration of Temperature Control Device 20]

Figure 5:
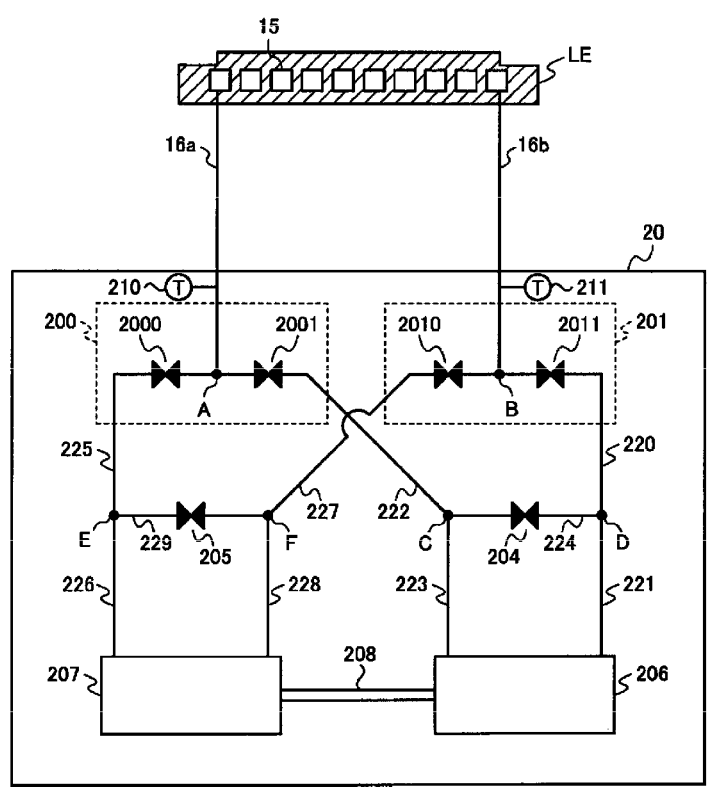
FIG. 5 is a diagram illustrating an example of a temperature control device according to the present exemplary embodiment.

FIG. 5 is a diagram illustrating an example of a temperature control device according to the present exemplary embodiment. The temperature control device 20 is equipped with a first switch unit 200, a second switch unit 201, a first bypass valve 204, a second bypass valve 205, a first temperature controller 206 and a second temperature controller 207.

The first temperature controller 206 is connected to the pipe 16a via a pipe 223 and a pipe 222. Also, the first temperature controller 206 is connected to the pipe 16b via a pipe 221 and a pipe 220. In the present exemplary embodiment, the first temperature controller 206 controls the temperature of the first heat medium of the low temperature. The first temperature controller 206 supplies the temperature-controlled first heat medium into the flow path 15 of the lower electrode LE through the pipe 223, the pipe 222 and the pipe 16a. The heat medium supplied into the flow path 15 of the lower electrode LE is returned to the first temperature controller 206 through the pipe 16b, the pipe 220 and the pipe 221. Herein, the pipes including the pipe 223, the pipe 222 and the pipe 16a are an example of a supply pipe or a first supply pipe. Also, the pipes including the pipe 16b, the pipe 220 and the pipe 221 are an example of a return pipe or a first return pipe.

The second temperature controller 207 is connected to the pipe 16a and the pipe 222 at a connection position A via a pipe 226 and a pipe 225. Further, the second temperature controller 207 is connected to the pipe 16b and the pipe 220 at a connection position B via a pipe 228 and a pipe 227. In the present exemplary embodiment, the second temperature controller 207 controls the temperature of the second heat medium of the high temperature. The second temperature controller 207 supplies the temperature-controlled second heat medium into the flow path 15 of the lower electrode LE through the pipe 226, the pipe 225 and the pipe 16a. Then, the heat medium supplied into the flow path 15 of the lower electrode LE is returned to the second temperature controller 207 through the pipe 16b, the pipe 227 and the pipe 228. Herein, the pipes including the pipe 226 and the pipe 225 are an example of a second supply pipe. Also, the pipes including the pipe 227 and the pipe 228 are an example of a second return pipe.

The first temperature controller 206 and the second temperature controller 207 are connected to each other through a pipe 208. The pipe 208 controls a liquid surface in a tank that stores the first heat medium inside the first temperature controller 206 and a liquid surface in a tank that stores the second heat medium inside the second temperature controller 207. Accordingly, it is possible to suppress the leakage of the heat mediums.

The first switch unit 200 is disposed at a connection portion between the pipe 16a and the pipes 225 and 222 and switches the heat medium flowing in the flow path 15 of the lower electrode LE to the first heat medium or the second heat medium. The first switch unit 200 is equipped with a first supply valve 2000 and a second supply valve 2001.

The second switch unit 201 is disposed at a connection portion between the pipe 16b and the pipes 227 and 220 and switches the destination of the heat medium flowing out of the flow path 15 of the lower electrode LE to the first temperature controller 206 or the second temperature controller 207. The second switch unit 201 is equipped with a first return valve 2010 and a second return valve 2011. In the present exemplary embodiment, the first supply valve 2000, the second supply valve 2001, the first return valve 2010 and the second return valve 2011 are all two-way valves.

A pipe 224 is disposed between a connection position D between the pipe 220 and the pipe 221 and a connection position C between the pipe 222 and the pipe 223. The pipe 224 is an example of a bypass pipe. The first bypass valve 204 is disposed at the pipe 224.

A pipe 229 is disposed between a connection position F between the pipe 227 and the pipe 228 and a connection position E between the pipe 225 and the pipe 226. The second bypass valve 205 is disposed at the pipe 229.

A thermometer 210 configured to measure the temperature of an inlet side of the flow path 15 is disposed at the pipe 16a inside the temperature control device 20. Also, a thermometer 211 configured to measure the temperature of an outlet side of the flow path 15 is disposed at the pipe 16b inside the temperature control device 20. The thermometers 210 and 211 may be disposed outside the temperature control device 20. For example, the thermometers 210 and 211 may be disposed right under the lower electrode LE, e.g., at a connection portion between the pipe 16a and the flow path 15 and a connection portion between the flow path 15 and the pipe 16b, respectively, or at the midpoint between the lower electrode LE and the temperature control device 20.

Herein, opening/closing of each of the first supply valve 2000, the second supply valve 2001, the first return valve 2010, the second return valve 2011, the first bypass valve 204 and the second bypass valve 205 is controlled by the control device 11.

[Operation of Temperature Control Device 20]

Figure 6:
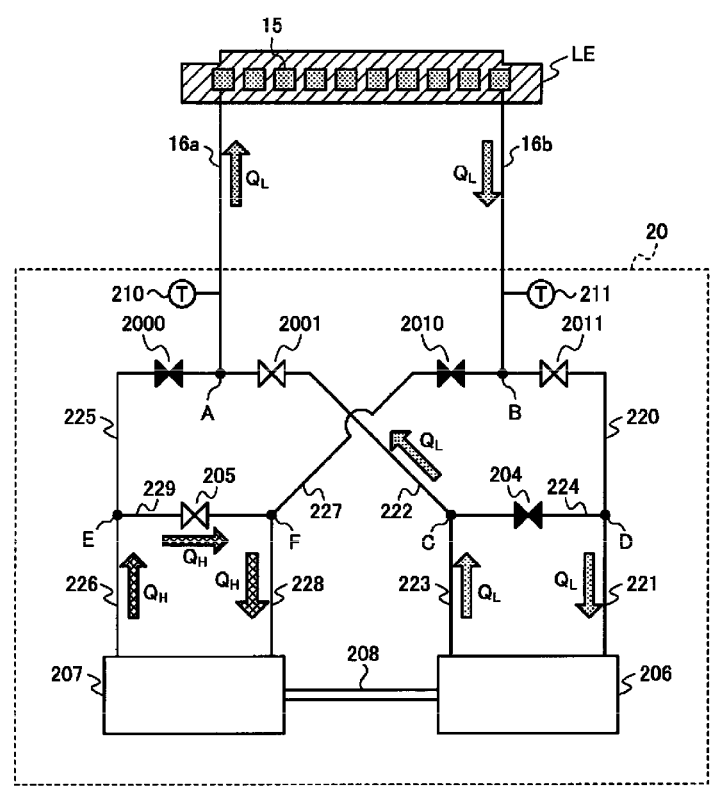
FIG. 6 is a diagram illustrating an example of a state where a heat medium is supplied from a first temperature controller.

FIG. 6 is a diagram illustrating an example of a state where the heat medium is supplied from the first temperature controller. FIG. 6 illustrates a state where the first heat medium of the low temperature is supplied into the flow path 15 from the first temperature controller 206. In the following drawings, open valves are indicated in white and closed valves are indicated in black.

As shown in FIG. 6, the first temperature controller 206 supplies the first heat medium into the pipe 223 at a flow rate $Q_L$. Since the first bypass valve 204 is closed, the first heat medium flows in the pipe 222 at the flow rate $Q_L$ via the connection position C. Since the first supply valve 2000 is closed and the second supply valve 2001 is opened, the first heat medium flows in the pipe 16a on the inlet side at the flow rate $Q_L$ via the second supply valve 2001 and the connection position A to be supplied into the flow path 15 inside the lower electrode LE.

The first heat medium flows in the flow path 15 and then flows to the connection position B at the flow rate $Q_L$ via the pipe 16b on the outlet side thereof. Since the first return valve 2010 is closed, the first heat medium flows from the pipe 16b to the pipe 220 at the flow rate $Q_L$ via the connection position B and the second return valve 2011. Since the first bypass valve 204 is closed, the first heat medium flows in the pipe 221 at the flow rate $Q_L$ via the connection position D and returns to the first temperature controller 206. Here, the temperature of the first heat medium is controlled based on a measurement value of the thermometer 210.

Meanwhile, the second heat medium of the high temperature supplied from the second temperature controller 207 is supplied into the pipe 226 at a flow rate $Q_H$. Since the first supply valve 2000 and the first return valve 2010 are closed and the second bypass valve 205 is opened, the second heat medium flows in the pipe 226, the connection position E, the pipe 229, the second bypass valve 205, the connection position F and the pipe 228 at the flow rate $Q_H$ and returns to the second temperature controller 207.

Figure 7:
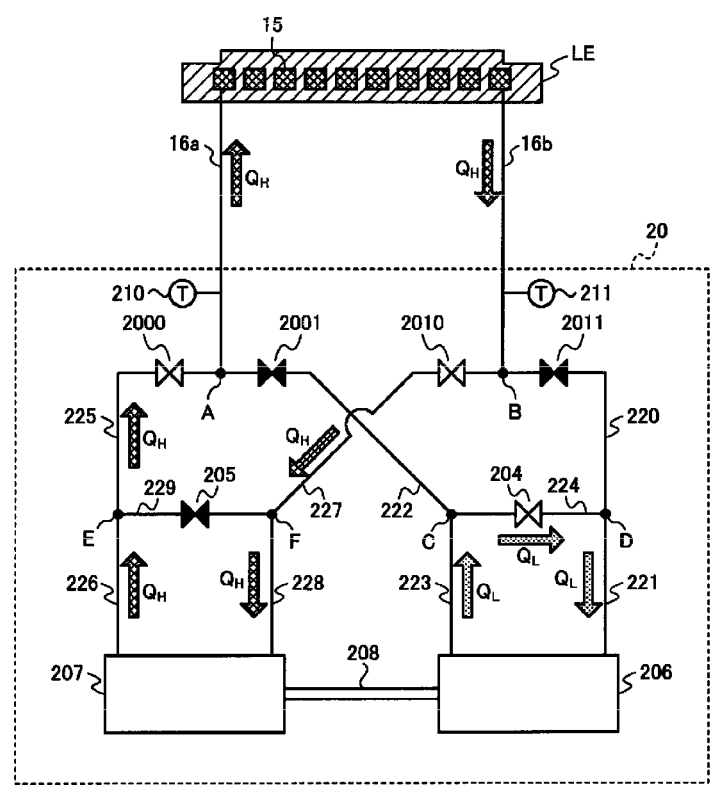
FIG. 7 is a diagram illustrating an example of a state where a heat medium is supplied from a second temperature controller.

FIG. 7 is a diagram illustrating an example of a state where the heat medium is supplied from the second temperature controller. FIG. 7 illustrates a state where the second heat medium of the high temperature is supplied into the flow path 15 from the second temperature controller 207 when the cleaning processing (WLDC) is performed.

As shown in FIG. 7, the second temperature controller 207 supplies the second heat medium into the pipe 226 at the flow rate $Q_H$. Since the second bypass valve 205 is closed, the second heat medium flows in the pipe 225 at the flow rate $Q_H$ via the connection position E. Since the first supply valve 2000 is opened and the second supply valve 2001 is closed, the second heat medium flows in the pipe 16a on the inlet side at the flow rate $Q_H$ via the first supply valve 2000 and the connection position A to be supplied into the flow path 15 inside the lower electrode LE.

The second heat medium flows in the flow path 15 and then flows to the connection position B at the flow rate $Q_H$ via the pipe 16b on the outlet side. Since the second return valve 2011 is closed, the second heat medium flows from the pipe 16b to the pipe 227 at the flow rate $Q_H$ via the connection position B and the first return valve 2010. Since the second bypass valve 205 is closed, the second heat medium flows in the pipe 228 at the flow rate $Q_H$ via the connection position F and returns to the second temperature controller 207. Here, the temperature of the second heat medium is controlled based on a measurement value of the thermometer 211.

Meanwhile, the first heat medium of the low temperature supplied from the first temperature controller 206 is supplied into the pipe 223 at the flow rate $Q_L$. Since the second supply valve 2001 and the second return valve 2011 are closed and the first bypass valve 204 is opened, the first heat medium flows in the pipe 223, the connection position C, the first bypass valve 204, the pipe 224, the connection position D and the pipe 221 at the flow rate $Q_L$ and returns to the first temperature controller 206.

[Switchover of Heat Medium]

When completing the etching processing and performing the WLDC, the control device 11 switches a state of the heat medium to be supplied into the flow path 15 inside the lower electrode LE from the state shown in FIG. 6 to the state shown in FIG. 7 in order to quickly switch the temperature of the placing table PD. That is, the control device 11 switches the first heat medium of the low temperature supplied from the first temperature controller 206 to the second heat medium of the high temperature supplied from the second temperature controller 207. Further, in the following description, there will be explained an example where the temperature of the first heat medium of the low temperature is −50° C. and the temperature of the second heat medium of the high temperature is 50° C.

Figure 8:
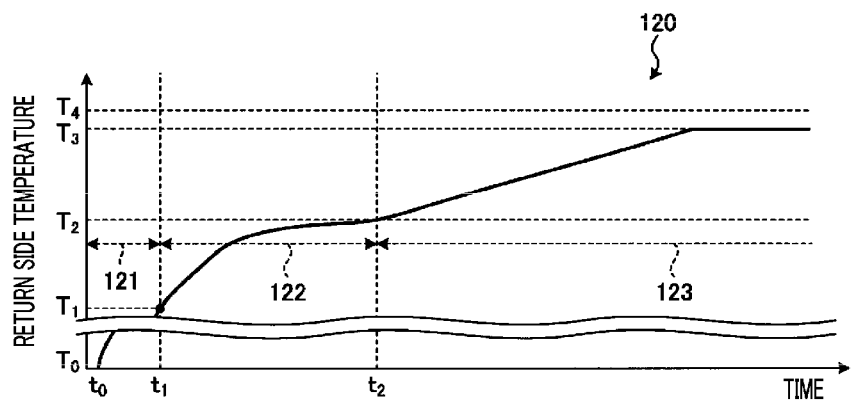
FIG. 8 is an example of a temperature control graph for a case where a temperature of a heat medium is equal to or smaller than a set value according to the present exemplary embodiment.
Figure 9:
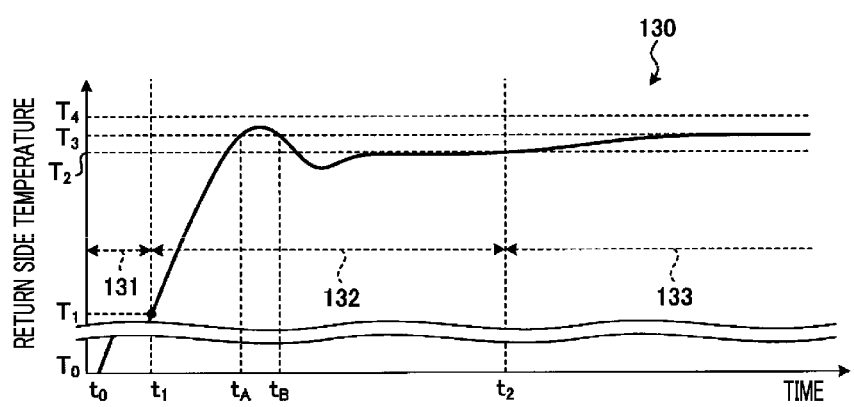
FIG. 9 is an example of a temperature control graph for a case where the temperature of the heat medium is greater than the set value according to the present exemplary embodiment.

A transient state at the time of the switchover of the heat medium will be described with reference to FIG. 8 and FIG. 9. FIG. 8 is an example of a temperature control graph for a case where the temperature of the heat medium is equal to or smaller than a set value according to the present exemplary embodiment. FIG. 9 is an example of a temperature control graph for a case where the temperature of the heat medium is greater than the set value according to the present exemplary embodiment. A graph 120 of FIG. 8 and a graph 130 of FIG. 9 show the measurement value of the thermometer 211 on the outlet side of the flow path 15, i.e., a transient state of a return side temperature $T_r$.

The control device 11 performs different controls in a section 121 where the temperature is changed sharply, a section 122 where the temperature change is stabilized and a section 123 where the stabilized temperature is gradually increased to a set value, respectively, shown in the graph 120. Likewise, the control device 11 performs different controls in a section 131 where the temperature is changed sharply, a section 132 where the temperature change is stabilized and a section 133 where the stabilized temperature is gradually increased to a set value, respectively, shown in the graph 130.

The control device 11 performs the following control in the sections 121 and 131. First, the control device 11 controls each valve of the temperature control device 20 to switch the heat medium to be supplied into the flow path 15 from the first heat medium on the first temperature controller 206 side to the second heat medium on the second temperature controller 207 side. Here, the control device 11 may set a set temperature of the second temperature controller 207 when the return side temperature $T_r$ is stabilized to a set value $T_3$ in previous sections 123 and 133 as a set temperature of the second temperature controller 207 at the start of the present sections 121 and 131.

After waiting for a predetermined time period, the control device 11 starts to supply a cleaning gas into the processing vessel 12 to ignite plasma. Here, $O_2$ gas may be used as the cleaning gas. In the graphs 120 and 130, a plasma ignition time is represented by to and a return side temperature at that time is represented by $T_0$. Herein, $T_0$ is, for example, $-50°$ C. In the lower electrode LE, the temperature is increased by heat applied from the plasma as well as the second heat medium in the flow path 15 in which the first heat medium has been pushed out by the second heat medium. Also, the return side temperature $T_r$ is increased. The control device 11 calculates the slope of temperature change based on a certain time between the time $t_0$ and a time $t_1$. The certain time may be, for example, a time until a predetermined time period elapses after the switchover of the heat medium or a time until the temperature reaches a predetermined temperature after the switchover of the heat medium. Further, the return side temperature $T_r$ at the time $t_1$ is represented by $T_1$. Here, $T_1$ may be set to, for example, $30°$ C. to $40°$ C.

The control device 11 determines whether or not the calculated slope of temperature change is equal to or greater than a threshold value $m_1$. If it is determined that the slope of temperature change is equal to or greater than the threshold value $m_1$ (i.e., in the case shown in the graph 130), the control device 11 lowers the set temperature of the second temperature controller 207. If it is determined that the slope of temperature change is smaller than the threshold value $m_1$ (i.e., in the case shown in the graph 120), the control device 11 does not change the set temperature of the second temperature controller 207. At the time $t_1$, the control device 11 performs the control over the sections 122 and 132. Here, the threshold value $m_1$ is obtained in advance by experiments or the like and may reflect a result of a previous temperature control processing.

The control device 11 performs the following control in the sections 122 and 132. The control device 11 determines whether or not the return side temperature $T_r$ exceeds a set value $T_3$. Here, the set value $T_3$ refers to a temperature lower than the vaporization temperature of the second heat medium and may be a temperature as high as possible which is equal to, for example, a vaporization temperature $T_4 - 5°$ C. For example, if the vaporization temperature $T_4$ is set to $55°$ C., the set value $T_3$ may be $50°$ C. Also, the set value $T_3$ may be a temperature, for example, $54.5°$ C., right before the vaporization temperature $T_4$. If the return side temperature $T_r$ does not exceed the set value $T_3$, the control device 11 determines whether or not a variation amount m of the return side temperature $T_r$ is equal to or greater than a threshold value $m_2$. If it is determined that the variation amount m of the return side temperature $T_r$ is smaller than the threshold value $m_2$, the control device 11 determines that the temperature change of the second heat medium is stabilized and performs the control over the sections 123 and 133. Meanwhile, if it is determined that the variation amount m of the return side temperature $T_r$ is equal to or greater than the threshold value $m_2$, the control device 11 returns to determine whether or not the return side temperature $T_r$ exceeds the set value $T_3$. Here, the threshold value $m_2$ is obtained in advance by experiments or the like.

If it is determined that the return side temperature $T_r$ exceeds the set value $T_3$ (i.e., in the case shown in the graph 130), the control device 11 switches the heat medium to be supplied into the flow path 15 to the first heat medium on the first temperature controller 206 side. Also, the control device 11 lowers the set temperature of the second temperature controller 207. That is, the control device 11 controls the temperature of the heat medium to be supplied into the flow path 15 by combining the switchover of the heat medium at a high response speed with the change of the set temperature of the second temperature controller 207 at a low response speed. After waiting for a predetermined time period, the control device 11 determines whether or not the return side temperature $T_r$ is equal to or greater than the vaporization temperature $T_4$. If it is determined that the return side temperature $T_r$ is equal to or greater than the vaporization temperature $T_4$, the control device 11 notifies an error and stops the temperature control processing and the cleaning processing.

If it is determined that the return side temperature $T_r$ is smaller than the vaporization temperature 14, the control device 11 determines whether or not the return side temperature $T_r$ is smaller than the set value $T_3$. If it is determined that the return side temperature $T_r$ is equal to or greater than the set value $T_3$, the control device 11 waits for a predetermined time period and then returns to determine whether or not the return side temperature $T_r$ is equal to or greater than the vaporization temperature $T_4$. If it is determined that the return side temperature $T_r$ is smaller than the set value $T_3$, the control device 11 switches the heat medium to be supplied into the flow path 15 to the second heat medium on the second temperature controller 207 side and returns to determine whether or not the return side temperature $T_r$ exceeds the set value $T_3$. The control device 11 may wait for a predetermined time period instead of determining whether or not the return side temperature $T_r$ is smaller than the set value $T_3$ and then may switch the heat medium to be supplied into the flow path 15 to the second heat medium on the second temperature controller 207 side.

Hereinafter, the temperature change in the sections 122 and 132 will be described. As shown in the graph 120, if the temperature of the second heat medium does not exceed the set value $T_3$, the return side temperature $T_r$ increases from the temperature $T_1$ at the time $t_1$ to a temperature $T_2$ in a stable state without an overshoot. In this case, the temperature $T_2$ in the stable state may be, for example, $45°$ C. Meanwhile, as shown in the graph 130, if the temperature of the second heat medium exceeds the set value $T_3$, the heat medium is first switched to the first heat medium of the low temperature from a time $t_A$ when the temperature of the second heat medium exceeds the set value $T_3$ to a time $t_B$ when the temperature of the second heat medium is equal to or smaller than the set value $T_3$. Then, the return side temperature $T_r$ undershoots the temperature $T_2$ in the stable state, and then, is switched to increase again and gradually increases to the temperature $T_2$ in the stable state. In this case, the temperature $T_2$ in the stable state may be, for example, 49° C. That is, a time $t_2$ when the return side temperature $T_r$ reaches the temperature $T_2$ in the stable state varies depending on the temperature of the second heat medium. Also, the temperature $T_2$ in the stable state is an example of a third temperature.

The control device 11 performs the following control in the sections 123 and 133. The control device 11 adjusts the set temperature of the second temperature controller 207 in order for the return side temperature $T_r$ to reach the set value $T_3$. After waiting for a predetermined time period, the control device 11 determines whether or not the return side temperature $T_r$ is stabilized to the set value $T_3$. If the return side temperature $T_r$ is not stabilized to the set value $T_3$, the control device 11 continues to adjust the set temperature of the second temperature controller 207. If the return side temperature $T_r$ exceeds the set value $T_3$, the control device 11 may perform the same control as the control in the sections 122 and 123. If the return side temperature $T_r$ is stabilized to the set value $T_3$, the control device 11 maintains the return side temperature $T_r$ to be stabilized to the set value $T_3$ until the WLDC is completed. The WLDC is ended when the time estimated to complete the removal of the shoulder deposit based on the removal rate of the shoulder deposit at the set value $T_3$ elapses, or ended when an EPD (End-Point Detector) determines that the removal of the shoulder deposit is completed.

[Temperature Control Method]

Figure 10:
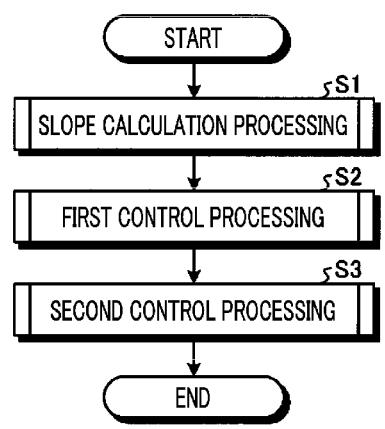
FIG. 10 is a flowchart showing an example of a temperature control processing according to the present exemplary embodiment.

Hereinafter, a temperature control method according to the present exemplary embodiment will be described. FIG. 10 is a flowchart showing an example of a temperature control processing according to the present exemplary embodiment.

First, the control device 11 performs a slope calculation processing configured to calculate the slope of temperature change when the heat medium is switched from the low temperature side to the high temperature side (process S1).

Figure 11:
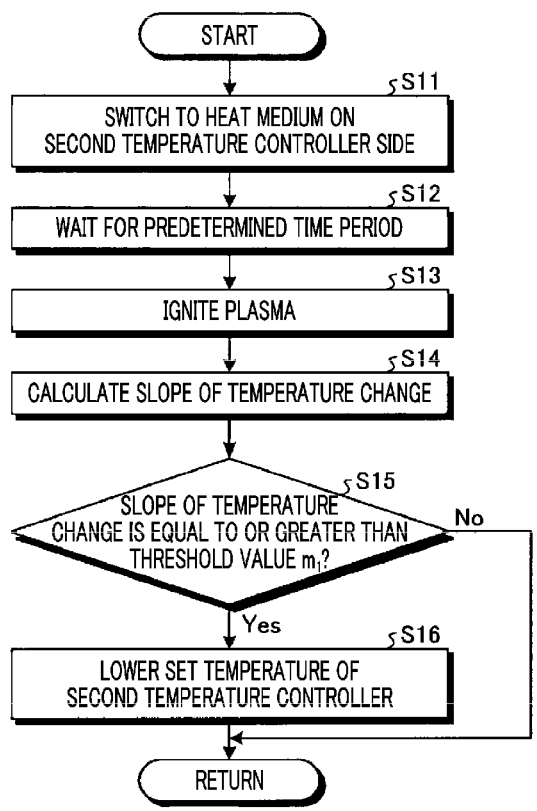
FIG. 11 is a flowchart showing an example of a slope calculation processing according to the present exemplary embodiment.

Hereinafter, the slope calculation processing will be described with reference to FIG. 11. FIG. 11 is a flowchart showing an example of the slope calculation processing according to the present exemplary embodiment.

The control device 11 controls each valve of the temperature control device 20 to switch the heat medium to be supplied into the flow path 15 to the second heat medium on the second temperature controller 207 side (process S11). Here, the control device 11 switches an input value of the temperature from the measurement value of the thermometer 210 to the measurement value of the thermometer 211. The control device 11 waits for a predetermined time period (process S12) and then starts to supply the cleaning gas into the processing vessel 12 to ignite plasma (process S13). The control device 11 calculates the slope of temperature change based on a certain time between the time $t_0$ and the time $t_1$ (process S14).

The control device 11 determines whether or not the calculated slope of temperature change is equal to or greater than the threshold value $m_1$ (process S15). If it is determined that the slope of temperature change is equal to or greater than the threshold value $m_1$ (process S15: Yes), the control device 11 lowers the set temperature of the second temperature controller 207 (process S16) and ends the slope calculation processing to return to the temperature control processing. If it is determined that the slope of temperature change is smaller than the threshold value $m_1$ (process S15: No), the control device 11 does not change the set temperature of the second temperature controller 207 and ends the temperature control processing to return to the slope calculation processing. Accordingly, the control device 11 can calculate the slope of temperature change.

Then, the control device 11 performs a first control processing for controlling the temperature change of the second heat medium to be stabilized (process S2).

Figure 12:
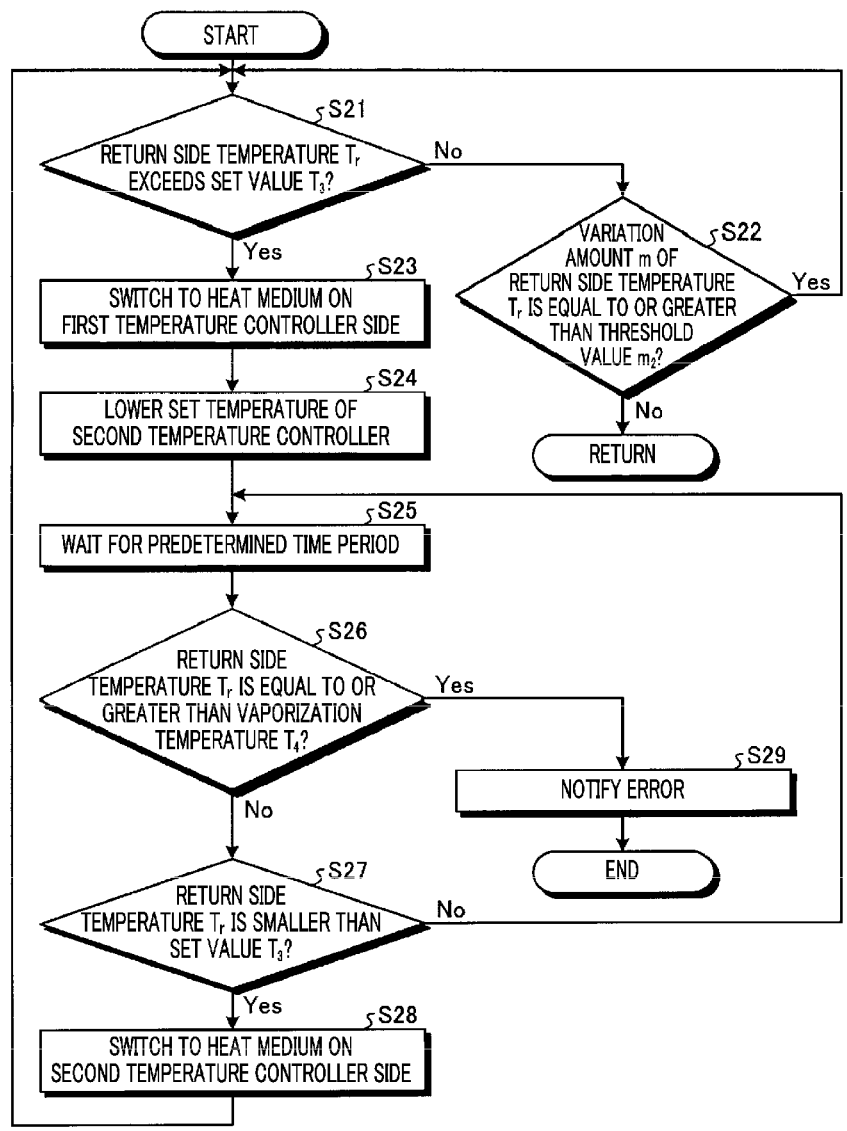
FIG. 12 is a flowchart showing an example of a first control processing according to the present exemplary embodiment.

Hereinafter, the first control processing will be described with reference to FIG. 12. FIG. 12 is a flowchart showing an example of the first control processing according to the present exemplary embodiment.

The control device 11 determines whether or not the return side temperature $T_r$ exceeds the set value $T_3$ (process S21). If the return side temperature $T_r$ does not exceed the set value $T_3$ (process S21: No), the control device 11 determines whether or not the variation amount m of the return side temperature $T_r$ is equal to or greater than the threshold value $m_2$ (process S22). If it is determined that the variation amount m of the return side temperature $T_r$ is smaller than the threshold value $m_2$ (process S22: No), the control device 11 determines that the return side temperature $T_r$ is stabilized to the temperature $T_2$ in the stable state and ends the first control processing to return to the temperature control processing. Meanwhile, if it is determined that the variation amount m of the return side temperature $T_r$ is equal to or greater than the threshold value $m_2$ (process S22: Yes), the control device 11 returns to the process S21.

If it is determined that the return side temperature $T_r$ exceeds the set value $T_3$ (process S21: Yes), the control device 11 switches the heat medium to be supplied into the flow path 15 to the first heat medium on the first temperature controller 206 side (process S23). Also, the control device 11 lowers the set temperature of the second temperature controller 207 (process S24). The control device 11 waits for a predetermined time period (process S25) and then determines whether or not the return side temperature $T_r$ is equal to or greater than the vaporization temperature $T_4$ (process S26). If it is determined that the return side temperature $T_r$ is equal to or greater than the vaporization temperature $T_4$ (process S26: Yes), the control device 11 notifies an error and stops the temperature control processing and the WLDC.

If it is determined that the return side temperature $T_r$ is smaller than the vaporization temperature $T_4$ (process S26: No), the control device 11 determines whether or not the return side temperature $T_r$ is smaller than the set value $T_3$ (process S27). If it is determined that the return side temperature $T_r$ is equal to or greater than the set value $T_3$ (process S27: No), the control device 11 returns to the process S25. If it is determined that the return side temperature $T_r$ is smaller than the set value $T_3$ (process S27: Yes), the control device 11 switches the heat medium to be supplied into the flow path 15 to the second heat medium on the second temperature controller 207 side (process S28) to return to the process S21. Accordingly, the control device 11 can stabilize the return side temperature Tr.

When the first control processing is completed, the control device 11 performs a second control processing configured to gradually increase the stabilized temperatures to a set value (process S3).

Figure 13:
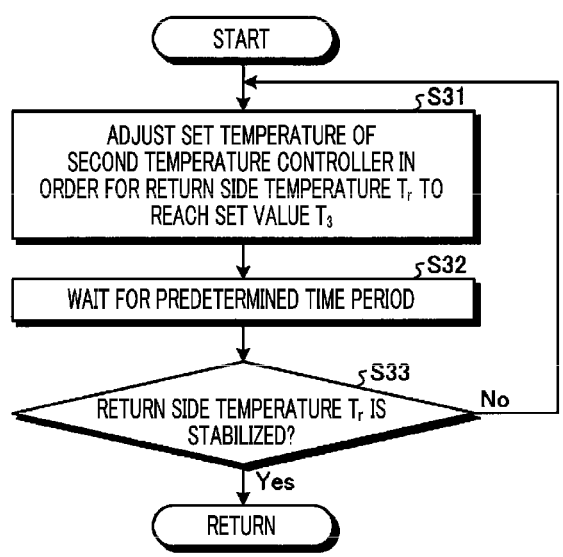
FIG. 13 is a flowchart showing an example of a second control processing according to the present exemplary embodiment.

Hereinafter, the second control processing will be described with reference to FIG. 13. FIG. 13 is a flowchart showing an example of the second control processing according to the present exemplary embodiment.

The control device 11 adjusts the set temperature of the second temperature controller 207 in order for the return side temperature $T_r$ to reach the set value $T_3$ (process S31). The control device 11 waits for a predetermined time period (process S32) and then determines whether or not the return side temperature $T_r$ is stabilized to the set value $T_3$ (process S33). If the return side temperature $T_r$ is not stabilized to the set value $T_3$ (process S33: No), the control device 11 returns to the process S31. If the return side temperature $T_r$ is stabilized to the set value $T_3$ (process S33: Yes), the control device 11 ends the second control processing and returns to the temperature control processing, and then, ends the temperature control processing. Accordingly, the control device 11 can stabilize the return side temperature $T_r$ to the set value $T_3$. That is, at the time of transition from the low temperature etching to the WLDC, it is possible to improve the removal rate of the shoulder deposit and reduce the cleaning time by controlling the temperature of the heat medium to be as high as possible without vaporizing the heat medium. Also, it is possible to suppress an attraction error of the wafer caused by the shoulder deposit and thus possible to stably operate the plasma processing apparatus 1. Since the cleaning time can be reduced, it is possible to reduce the productivity of wafers. Further, it is possible to reduce a difference in cleaning time between apparatuses caused by the length of the pipe.

MODIFICATION EXAMPLE

Figure 14:
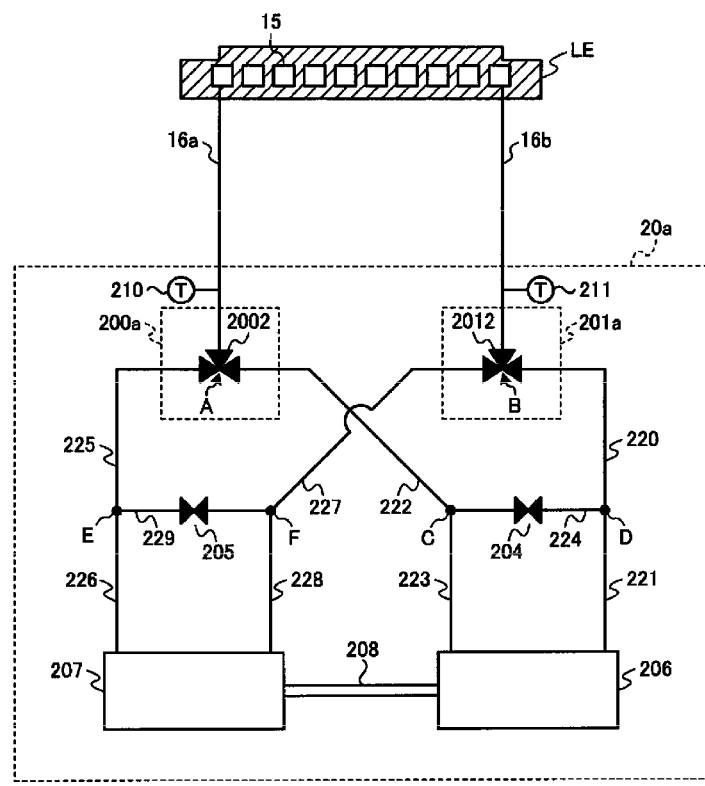
FIG. 14 is a diagram illustrating an example of a temperature control device according to a modification example.

In the above-described exemplary embodiment, the first switch unit 200 is implemented by the first supply valve 2000 and the second supply valve 2001 which are two-way valves, and the second switch unit 201 is implemented by the first return valve 2010 and the second return valve 2011 which are two-way valves. Each of the first switch unit 200 and the second switch unit 201 may be implemented by a three-way valve. FIG. 14 is a diagram illustrating an example of a temperature control device according to a modification example. A temperature control device 20a shown in FIG. 14 is equipped with a first switch unit 200a and a second switch unit 201a instead of the first switch unit 200 and the second switch unit 201 when compared to the temperature control device 20 according to the above-described exemplary embodiment.

The first switch unit 200a is implemented by a supply valve 2002 which is a three-way valve. The supply valve 2002 corresponds to the first supply valve 2000 and the second supply valve 2001 for the first switch unit 200. Like the first switch unit 200, the first switch unit 200a switches the heat medium flowing in the flow path 15 of the lower electrode LE to the first heat medium or the second heat medium.

The second switch unit 201a is implemented by a return valve 2012 which is a three-way valve. The return valve 2012 corresponds to the first return valve 2010 and the second return valve 2011 for the second switch unit 201. Like the second switch unit 201, the second switch unit 201a switches the destination of the heat medium flowing out of the flow path 15 of the lower electrode LE to the first temperature controller 206 or the second temperature controller 207. As described above, even if the three-way valves are used instead of the two-way valves, it is possible to perform the switchover between the first heat medium and the second heat medium.

According to the present exemplary embodiment describe above, the control device 11 switches the heat medium to be supplied into the flow path 15 provided inside the placing table PD, which is disposed inside the processing vessel 12 of the plasma processing apparatus 1 and configured to place a substrate thereon, from the heat medium of the first temperature supplied from the first temperature controller 206 when the etching processing is performed on the substrate to the heat medium of the second temperature supplied from the second temperature controller 207 when the substrate is carried out of the processing vessel 12 and then the cleaning process configured to remove the reaction product adhering to the electrostatic chuck ESC provided on the placing table PD is performed. Also, the control device 11 starts to supply the cleaning gas into the processing vessel 12 to ignite the plasma. Further, the control device 11 calculates the slope of temperature change of the heat medium based on the temperature of the heat medium at the outlet side of the flow path 15. Furthermore, the control device 11 controls the second temperature controller 207 until the temperature $T_r$ of the heat medium at the outlet side of the flow path 15 is stabilized to the third temperature $T_2$ lower than the predetermined set value $T_3$. Moreover, the control device 11 controls the second temperature controller 207 in order for the temperature $T_r$ of the heat medium at the outlet side of the flow path 15 to reach the set value $T_3$. As a result, at the time of transition from the low temperature etching to the WLDC, it is possible to reduce the cleaning time by controlling the temperature of the heat medium to be as high as possible without vaporizing the heat medium.

Further, according to the present exemplary embodiment, when the temperature $T_r$ of the heat medium at the outlet side of the flow path 15 exceeds the set value $T_3$, the control device 11 switches the source of the heat medium to be supplied into the flow path 15 to the first temperature controller 206. As a result, the temperature $T_r$ of the heat medium can be suppressed from reaching the vaporization temperature $T_4$.

Furthermore, according to the present exemplary embodiment, after the predetermined time period elapses, the control device 11 switches the source of the heat medium to be supplied into the flow path 15 to the second temperature controller. As a result, it is possible to suppress the big drop in the temperature $T_r$ of the heat medium from the set value $T_3$.

Moreover, according to the present exemplary embodiment, when the temperature $T_r$ of the heat medium at the outlet side of the flow path 15 is smaller than the set value $T_3$, the control device 11 switches the source of the heat medium to be supplied into the flow path 15 to the second temperature controller 207. As a result, it is possible to suppress the big drop in the temperature $T_r$ of the heat medium from the set value $T_3$.

Besides, according to the present exemplary embodiment, when the calculated slope of temperature change is equal to or greater than a threshold value, the control device 11 controls the second temperature controller 207 to lower the second temperature. As a result, the temperature $T_r$ of the heat medium can be suppressed from reaching the vaporization temperature $T_4$.

Also, according to the present exemplary embodiment, the control device 11 sets the set temperature of the second temperature controller 207 when the temperature of the heat medium at the outlet side of the flow path 15 reaches the set value $T_3$ in a previous second control process (second control processing) as the second temperature (temperature of the second heat medium). As a result, the temperature of the heat medium can be more quickly stabilized to the processing temperature for the WLDC.

Further, according to the present exemplary embodiment, the set value $T_3$ is lower than the vaporization temperature $T_4$ of the heat medium. As a result, the temperature $T_r$ of the heat medium can be suppressed from reaching the vaporization temperature 14.

In the above-described exemplary embodiment, $O_2$ gas is used as the cleaning gas. However, the technology of the present disclosure is not limited thereto. Other oxygen-containing gases such as CO gas, $CO_2$ gas and $O_3$ gas may be used as the cleaning gas.

Also, in the above-described exemplary embodiment, the deposit (reaction product) adhering to the shoulder portion of the electrostatic chuck or the edge ring is the organic deposit such as CF-based polymer. However, the technology of the present disclosure is not limited thereto. Depending on the type of the etching target film on the substrate or the conditions used for the etching, the deposit may contain an inorganic material such as silicon or a metal in addition to the CF-based polymer. In this case, for example, a halogen-containing gas may be added to the $O_2$ gas which is the cleaning gas. Examples of the halogen-containing gas may include a fluorine-based gas such as $CF_4$ gas and $NF_3$ gas. Also, the halogen-containing gas may be a chlorine-based gas such as $Cl_2$ gas or a bromine-based gas such as HBr gas. Even if the deposit (reaction product) contains the inorganic material such as silicon or the metal, the removal rate can be improved by adjusting the temperature of the placing table to be high during the cleaning.

Further, in the above-described exemplary embodiments, capacitively coupled plasma (CCP) is used as an example of a plasma source. However, the technology of the present disclosure is not limited thereto. For example, inductively coupled plasma (ICP), microwave-excited surface wave plasma (SWP), electron cyclotron resonance plasma (ECP) or helicon wave-excited plasma (HWP) may be used as the plasma source.

Furthermore, in the above-described exemplary embodiments, the plasma etching apparatus has been described as the plasma processing apparatus 1. However, the technology of the present disclosure is not limited thereto. The technology of the present disclosure can be applied to a film forming apparatus, a modifying apparatus or a cleaning apparatus in addition to the etching apparatus as long as the apparatus is capable of controlling the temperature of the temperature control target object, such as wafer W, by using the temperature-controlled heat medium.

The exemplary embodiments disclosed herein are illustrative in all aspects and not limited thereto. The above-described exemplary embodiments may be omitted, substituted, or changed in various forms without departing from the scope of the appended claims.

According to the exemplary embodiments, it is possible to reduce the cleaning time.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A temperature control method, comprising:
switching a heat medium to be supplied into a flow path provided inside a placing table from a heat medium of a first temperature to a heat medium of a second temperature, the placing table being disposed inside a processing vessel of a plasma processing apparatus and configured to place a substrate thereon, the heat medium of the first temperature being supplied from a first temperature controller when an etching processing is performed on the substrate, the heat medium of the second temperature being supplied from a second temperature controller when a cleaning process configured to remove a reaction product adhering to an electrostatic chuck provided on the placing table is performed after the substrate is carried out of the processing vessel;
after the switching, igniting plasma by starting to supply a cleaning gas into the processing vessel;
calculating a slope of temperature change of the heat medium based on a temperature of the heat medium at an outlet side of the flow path;
controlling the second temperature controller until the temperature of the heat medium at the outlet side of the flow path is stabilized to a third temperature lower than a predetermined set value; and
controlling the second temperature controller in order for the temperature of the heat medium at the outlet side of the flow path to reach the set value,
wherein the first temperature is in a range of about −40° C. to about −80° C., and
the set value is lower than a vaporization temperature of the heat medium.

2. The temperature control method of claim 1,
wherein, in the calculating of the slope of temperature change, when the calculated slope of temperature change is equal to or greater than a threshold value, the second temperature controller is controlled to lower the second temperature.

3. The temperature control method of claim 1,
wherein, in the switching of the heat medium to be supplied into the flow path provided inside the placing table from the heat medium of the first temperature to the heat medium of the second temperature, a set temperature of the second temperature controller when the temperature of the heat medium at the outlet side of the flow path reaches the set value in a previous controlling of the second temperature controller in order for the temperature of the heat medium at the outlet side of the flow path to reach the set value is set as the second temperature.

4. The temperature control method of claim 1,
wherein the cleaning gas includes an oxygen-containing gas selected from a group consisting of $O_2$ gas, CO gas, $CO_2$ gas, and $O_3$ gas.

5. The temperature control method of claim 1,
wherein the cleaning gas includes a halogen-containing gas.

6. The temperature control method of claim 1,
wherein, in the controlling of the second temperature controller until the temperature of the heat medium at the outlet side of the flow path is stabilized, when the temperature of the heat medium at the outlet side of the flow path exceeds the set value, a source of the heat medium for the flow path is switched to the first temperature controller.

7. The temperature control method of claim 6,
wherein, in the controlling of the second temperature controller until the temperature of the heat medium at the outlet side of the flow path is stabilized, the source of the heat medium for the flow path is switched to the second temperature controller, after a predetermined time period elapses.

8. The temperature control method of claim 6, wherein, in the controlling of the second temperature controller until the temperature of the heat medium at the outlet side of the flow path is stabilized, when the temperature of the heat medium at the outlet side of the flow path is smaller than the set value, the source of the heat medium for the flow path is switched to the second temperature controller.

9. A substrate processing apparatus, comprising:

a processing vessel;

a placing table disposed inside the processing vessel and configured to place a substrate thereon;

a first temperature controller configured to supply a heat medium of a first temperature into a flow path provided inside the placing table;

a second temperature controller configured to supply a heat medium of a second temperature into the flow path; and a controller, wherein the controller is configured to control the plasma processing apparatus to switch the heat medium to be supplied into the flow path from the heat medium of the first temperature to the heat medium of the second temperature, the heat medium of the first temperature being supplied when an etching processing is performed on the substrate, the heat medium of the second temperature being supplied when a cleaning process configured to remove a reaction product adhering to an electrostatic chuck provided on the placing table is performed after the substrate is carried out of the processing vessel, after the heat medium is switched, the controller is configured to control the plasma processing apparatus to ignite plasma by starting to supply a cleaning gas into the processing vessel, the controller is configured to control the plasma processing apparatus to calculate a slope of temperature change of the heat medium based on a temperature of the heat medium at an outlet side of the flow path, the controller is configured to control the plasma processing apparatus to control the second temperature controller until the temperature of the heat medium at the outlet side of the flow path is stabilized to a third temperature lower than a predetermined set value, and the controller is configured to control the plasma processing apparatus to control the second temperature controller in order for the temperature of the heat medium at the outlet side of the flow path to reach the set value, wherein the first temperature is in a range of about −40° C. to about −80° C., and the set value is lower than a vaporization temperature of the heat medium.

\* \* \* \* \*